US008697507B2

(12) United States Patent
Mun et al.

(10) Patent No.: US 8,697,507 B2
(45) Date of Patent: Apr. 15, 2014

(54) TRANSISTOR OF SEMICONDUCTOR DEVICE AND METHOD OF FABRICATING THE SAME

(75) Inventors: Jae Kyoung Mun, Daejeon (KR); Hong Gu Ji, Daejeon (KR); Ho Kyun Ahn, Daejeon (KR); Hae Cheon Kim, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 13/004,750

(22) Filed: Jan. 11, 2011

(65) Prior Publication Data

US 2011/0143507 A1 Jun. 16, 2011

Related U.S. Application Data

(62) Division of application No. 11/280,608, filed on Nov. 15, 2005, now Pat. No. 7,893,462.

(30) Foreign Application Priority Data

Dec. 14, 2004 (KR) ................ 2004-105769
Jul. 7, 2005 (KR) ................ 2005-61301

(51) Int. Cl.
*H01L 21/338* (2006.01)

(52) U.S. Cl.
USPC .................. 438/176; 257/E21.304

(58) Field of Classification Search
USPC ............ 438/268, 176; 257/E21.304
See application file for complete search history.

(56) References Cited

U.S. PATENT DOCUMENTS 5,262,660 A   11/1993  Streit et al.
5,729,030 A * 3/1998   Yamamoto et al. ........... 257/103

(Continued)

FOREIGN PATENT DOCUMENTS

JP    03-066136    3/1991
JP    03-196574    8/1991

(Continued)

OTHER PUBLICATIONS

Lee, Jong-Lam, et al., "A Ku-Band T-Shaped Gate GaAs Power MESFET with High Breakdown Voltage for Satellite Communications," IEEE Elec. Dev. Lett., 19 (1998).
Lee, Jong-Lam, et al., "Microstructural evidence on direct contact of Au/Ge/Ni/Au ohmic metals to InGaAs channel in pseudomorphic high electron mobility transistor with undoped cap layer," Applied Physics Letters, vol. 73, No. 12 (Sep. 21, 1998), pp. 1670-1672.

(Continued)

*Primary Examiner* — Matthew Reames
(74) *Attorney, Agent, or Firm* — Blakely, Sokoloff, Taylor & Zafman

(57) ABSTRACT

Provided are a transistor of a semiconductor device and a method of fabricating the same. The transistor of a semiconductor device includes an epitaxial substrate having a buffer layer, a first silicon (Si) planar doped layer, a first conductive layer, a second Si planar doped layer having a different dopant concentration from the first Si planar doped layer, and a second conductive layer, which are sequentially formed on a semi-insulating substrate; a source electrode and a drain electrode formed on both sides of the second conductive layer to penetrate the first Si planar doped layer to a predetermined depth to form an ohmic contact; and a gate electrode formed on the second conductive layer between the source electrode and the drain electrode to form a contact with the second conductive layer, wherein the gate electrode, the source electrode and the drain electrode are electrically insulated by an insulating layer, and a predetermined part of an upper part of the gate electrode is formed to overlap at least one of the source electrode and the drain electrode. Therefore, a maximum voltage that can be applied to the switching device is increased due to increases of a gate turn-on voltage and a breakdown voltage, and decrease of a parallel conduction component. As a result of this improved power handling capability, high-power and low-distortion characteristics and high isolation can be expected from the switching device.

5 Claims, 5 Drawing Sheets

(56) References Cited

U.S. PATENT DOCUMENTS

| | | | |
|---|---|---|---|
| 5,872,369 | A | 2/1999 | Inokuchi |
| 6,057,566 | A | 5/2000 | Eisenbeiser et al. |
| 2002/0163012 | A1 | 11/2002 | Nihei et al. |
| 2003/0122152 | A1 | 7/2003 | Kim et al. |

FOREIGN PATENT DOCUMENTS

| | | |
|---|---|---|
| JP | 5-36723 | 2/1993 |
| JP | 5-102190 | 4/1993 |
| JP | 08-264762 | 10/1996 |
| JP | 9-232336 | 9/1997 |
| JP | 2002-353411 | 12/2002 |
| JP | 2003-100777 | 4/2003 |
| JP | 2003-203930 | 7/2003 |
| JP | 2004-111615 | 4/2004 |

OTHER PUBLICATIONS

Lee, Jong-Lam, et al., "Au/Ge-based Ohmic contact to an AlGaAs/InGaAs pseudomorphic high electron mobility transistor with an undoped cap layer," J. Vac. Sci. Technol. B 17(3), (May/Jun. 1999), pp. 1034-1039.

Nagayama, Akira, et al., "Low-Insertion-Loss DP3T MMIC Switch for Dual-Band Cellular Phones," IEEE Journal of Solid-State Circuits, vol. 34, No. 8 (Aug. 1999), pp. 1051-1055.

Yang, Ming-Ta, et al., "Device Linearity Comparisons Between Doped-Channel and Modulation-Doped Designed in Pseudomorphic . . . Heterostructures," IEEE Transactions on Electron Devices, vol. 43, No. 8 (Aug. 1996), pp. 1174-1180.

Zeghbroek, "Principle of Semiconductor Devices," http://ecee.colorado.edu/~bart/bootk/book/title.htm, Chapter 3, Section 5 (2004).

* cited by examiner

500

```
┌─────────────────────────────────────────────┐
│ SEQUENTIALLY FORMING A BUFFER LAYER, A FIRST│
│   SILICON (SI) PLANAR DOPED LAYER, A FIRST  │
│    CONDUCTIVE LAYER, A SECOND SI PLANAR     │
│  DOPED LAYER HAVING A DIFFERENT DOPANT      │
│ CONCENTRATION FROM THE FIRST SI PLANAR      │
│ DOPED LAYER, AND A SECOND CONDUCTIVE LAYER  │
│         ON A SEMI-INSULATING SUBSTRATE      │
│                      502                    │
└─────────────────────────────────────────────┘
                       │
                       ▼
┌─────────────────────────────────────────────┐
│ FORMING A THIN METAL FILM ON THE SECOND     │
│ CONDUCTIVE LAYER TO FORM A SOURCE ELECTRODE │
│  AND A DRAIN ELECTRODE FOR FORMING AN OHMIC │
│ CONTACT TO PENETRATE THE FIRST SI PLANAR    │
│    DOPED LAYER TO A PREDETERMINED DEPTH     │
│                      504                    │
└─────────────────────────────────────────────┘
                       │
                       ▼
┌─────────────────────────────────────────────┐
│  ETCHING A PART OF THE SECOND CONDUCTIVE    │
│        LAYER TO A PREDETERMINED DEPTH       │
│                      506                    │
└─────────────────────────────────────────────┘
                       │
                       ▼
┌─────────────────────────────────────────────┐
│  FORMING A FIRST INSULATING LAYER ON AN     │
│  ENTIRE UPPER SURFACE OF THE SOURCE         │
│  ELECTRODE, THE DRAIN ELECTRODE AND AN      │
│  EXPOSED PORTION OF THE SECOND CONDUCTIVE   │
│  LAYER, AND REMOVING A PORTION OF THE FIRST │
│  INSULATING LAYER TO EXPOSE A PREDETERMINED │
│  AREA OF THE ETCHED SECOND CONDUCTIVE LAYER │
│                      508                    │
└─────────────────────────────────────────────┘
                       │
                       ▼
┌─────────────────────────────────────────────┐
│ FORMING A GATE ELECTRODE ON THE EXPOSED     │
│ SECOND CONDUCTIVE LAYER SUCH THAT AN UPPER  │
│ PART OF THE GATE ELECTRODE OVERLAPS ONLY    │
│             THE DRAIN ELECTRODE             │
│                      510                    │
└─────────────────────────────────────────────┘
                       │
                       ▼
┌─────────────────────────────────────────────┐
│ FORMING A SECOND INSULATING LAYER ON AN     │
│ ENTIRE UPPER SURFACE OF A REMAINING PORTION │
│ OF THE FIRST INSULATING LAYER AND THE GATE  │
│ ELECTRODE, REMOVING THE FIRST AND SECOND    │
│ INSULATING LAYERS TO EXPOSE PREDETERMINED   │
│ AREAS OF THE SOURCE AND DRAIN ELECTRODES,   │
│ AND THEN FORMING PREDETERMINED METAL        │
│ PATTERNS ON THE EXPOSED SOURCE AND DRAIN    │
│                   ELECTRODES                │
│                      512                    │
└─────────────────────────────────────────────┘
```

FIG. 5

TRANSISTOR OF SEMICONDUCTOR DEVICE AND METHOD OF FABRICATING THE SAME

CROSS-REFERENCE TO RELATED APPLICATION

The present patent application is a Divisional of application Ser. No. 11/280,608, filed Nov. 15, 2005, now U.S. Pat. No. 7,893,462 which application claims priority to and the benefit of Korean Patent Application No. 2005-61301, filed Jul. 7, 2005, the disclosure of which is incorporated herein by reference in its entirety.

BACKGROUND

1. Field of the Invention

The present invention relates to a compound semiconductor switching device which is the core device of a compound semiconductor switch microwave monolithic integrated circuit (MMIC), and a method of fabricating the same. More particularly, the present invention relates to a transistor of a semiconductor device that has a low insertion loss, high isolation, and a fast switching speed and is suitable for a high-power low-distortion high-frequency control circuit, and a method of fabricating the same.

2. Discussion of Related Art

In general, many mobile communication devices such as cellular phones and wireless local area network (LAN) equipment use GHz-band microwaves, and a switching device for switching such high-frequency signals is used in a switching circuit of an antenna or in a transmitter/receiver switching circuit.

As such a switching device, a field effect transistor (FET), such as a high electron mobility transistor (HEMT) which is a compound semiconductor transistor or a metal-semiconductor field effect transistor (MESFET), is largely used because it has a good transmission characteristic, an excellent operating voltage characteristic, a low consuming current, a simple bias circuit and an easy implementation of multiport and integrated circuit in a high frequency band.

In addition, it is required to minimize an insertion loss and improve isolation and switching speed in a high-frequency switching circuit. Specifically, it is very important to design a high-power switching device having excellent linearity for a radio-frequency control circuit used in cellular and analog terminals.

In order to reduce the insertion loss, conventional techniques selected a method of lowering the resistance of a channel region of a transistor used for a switch circuit by designing the channel region such that its doping concentration or width is as increased as possible.

However, the conventional art has a problem in that capacitance due to a Schottky contact formed between a gate electrode and a channel area increases, and thus high-frequency input signals are leaked from the Schottky contact and the isolation is deteriorated.

To overcome this problem, conventionally, a shunt transistor is installed during a circuit designing process to improve the isolation. However, this method results in another problem of chip enlargement and thus the cost increase.

Therefore, in order to fabricate a high-power high-frequency control circuit having improved power handling capability using a low-power switching device, the conventional art uses a circuit design technique such as an impedance transformation technique, a stacked FET method, and an inductor/capacitor (LC) resonant circuit technique, or a device structure modification technique such as a squeezed-gate FET structure, two kinds of pinch-off voltage FET structure, and a multigate structure.

However, the circuit design technique has another drawback in that the chip size increases due to the transmission line of a λ/4 transformer, a plurality of FETs used therein, and an inductor and a capacitor added around the switching device, and thus the cost also increases. And, the conventional device structure modification technique, like the circuit design technique, has a problem of increased chip production cost due to an additional mask process and an increased distance between source and drain.

SUMMARY OF THE INVENTION

The present invention is directed to a transistor of a semiconductor device including an epitaxial substrate optimized to reduce an insertion loss in an on-state and to increase isolation in an off-state, and a method of fabricating the same.

The present invention is also directed to a transistor of a semiconductor device having an improved gate-drain breakdown voltage characteristic to allow a larger radio frequency (RF) voltage swing during a switching operation and to operate at a low voltage level, and a method of fabricating the same.

The present invention is also directed to a transistor of a semiconductor device reducing an effective gate voltage, which is a positive value, induced by a radio frequency (RF) swing to a gate electrode even though an induced signal has a high frequency, and thus having enhanced power and distortion characteristics, and a method of fabricating the same.

The present invention is also directed to a transistor of a semiconductor device capable of reducing a chip size increased by adding a circuit including an inductor and a capacitor arranged around the transistor.

One aspect of the present invention provides a transistor of a semiconductor device including: an epitaxial substrate having a buffer layer, a first silicon (Si) doped layer, a first conductive layer, a second Si doped layer having a different dopant concentration from the first Si doped layer, and a second conductive layer, which are sequentially formed on a semi-insulating substrate; a source electrode and a drain electrode formed on both sides of the second conductive layer to penetrate the first Si doped layer to a predetermined depth to form an ohmic contact: and a gate electrode formed on the second conductive layer between the source electrode and the drain electrode to form a contact with the second conductive layer, wherein the gate electrode, the source electrode and the drain electrode are electrically insulated by an insulating layer, and a predetermined part of an upper part of the gate electrode is formed to overlap at least one of the source electrode and the drain electrode.

Here, the upper part of the gate electrode is preferably formed into a "⌐" shape so that a predetermined part thereof overlaps the source electrode.

Preferably, the upper part of the gate electrode has a "⌐" shape so that a predetermined part thereof overlaps the drain electrode.

Preferably, the upper part of the gate electrode has a "T" shape so that the predetermined parts thereof overlap the source electrode and drain electrode, respectively.

Another aspect of the present invention provides a method of fabricating a transistor of a semiconductor device including the steps of: sequentially forming a buffer layer, a first silicon (Si) doped layer, a first conductive layer, a second Si doped layer having a different dopant concentration from the first Si doped layer, and a second conductive layer on a semi-insulating substrate; forming a thin metal film on the second conductive layer to form a source electrode and a drain electrode for forming an ohmic contact to penetrate the first Si doped layer to a predetermined depth; etching a part of the second conductive layer to a predetermined depth; forming a first insulating layer on an entire upper surface of the resultant structure to expose a predetermined area of the etched second conductive layer; forming a gate electrode on the exposed second conductive layer such that a predetermined part of an upper part of the gate electrode overlaps at least one of the source electrode and the drain electrode; and forming a second insulating layer on an entire upper surface of the resultant structure, removing the first and second insulating layers to expose predetermined areas of the source and drain electrodes, and then forming predetermined metal patterns on the exposed source and drain electrodes.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 5 is a flow chart illustrating a process for fabricating a transistor of a semiconductor device.

DETAILED DESCRIPTION OF EXEMPLARY EMBODIMENTS

The present invention will now be described more fully with reference to the accompanying drawings, in which exemplary embodiments of the invention are shown. This invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art.

Figure 1:
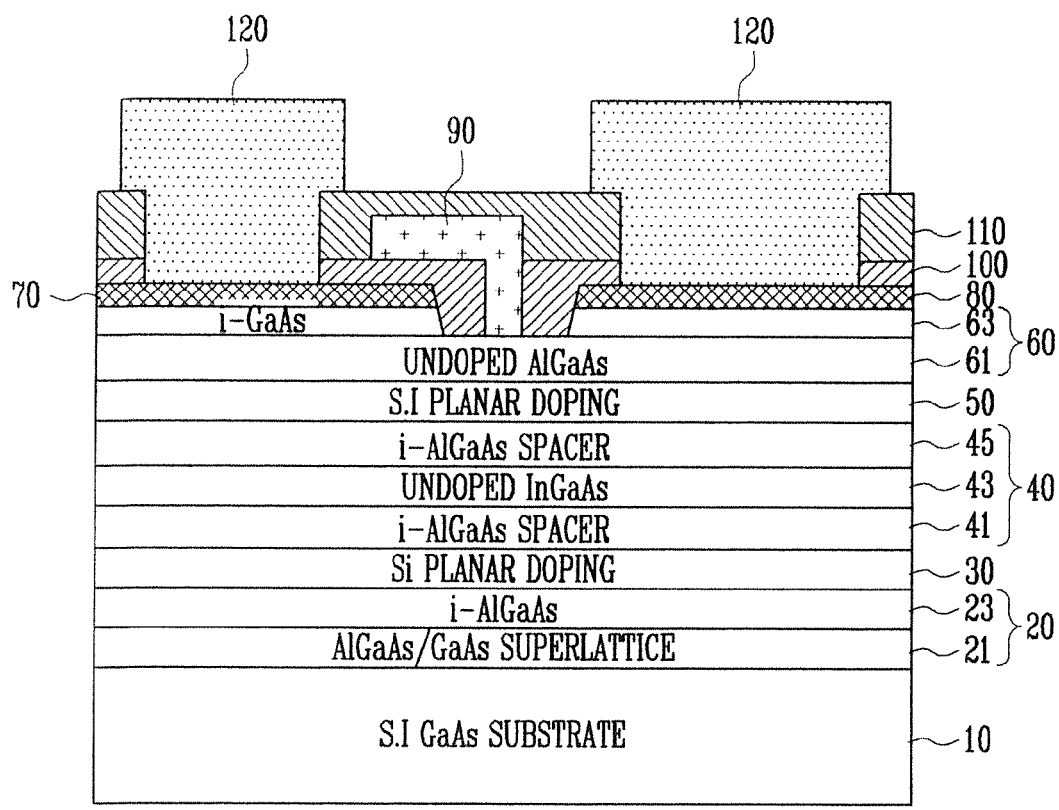
FIG. 1 is a schematic cross-sectional view illustrating a transistor of a semiconductor device according to an exemplary embodiment of the present invention.

FIG. 1 is a schematic cross-sectional view of a transistor of a semiconductor device according to an exemplary embodiment of the present invention. The transistor has an epitaxial structure optimized to increase an average dopant concentration of a channel layer thereof to reduce an insertion loss in an on-state, increase a gate breakdown voltage and a gate turn-on voltage to increase isolation in an off-state, and reduce leakage current in a channel layer.

Referring to FIG. 1, the transistor of the semiconductor device, i.e., a high-power high-frequency switching device, according to an exemplary embodiment of the present invention includes an epitaxial substrate having a buffer layer 20, a first Si doped layer (Si planar doping) 30, a first conductive layer 40, a second Si doped layer (Si planar doping) 50 having a different dopant concentration from the first Si doped layer 30, and a second conductive layer 60, which are sequentially formed on a GaAs semi-insulating substrate 10.

In addition, the transistor includes a source electrode 70 and a drain electrode 80 which are formed on both sides of the second conductive layer 60 penetrating the first Si doped layer 30 to a predetermined depth and form ohmic contacts, and a gate electrode 90 formed on the second conductive layer 60 between the source electrode 70 and the drain electrode 80 for contact with the second conductive layer 60.

In addition, the transistor includes a SiNx dielectric, i.e., a first insulating layer 100 and a second insulating layer 110, for electrically insulating the gate electrode 90, the source electrode 70, and the drain electrode 80 from each other, and predetermined metal patterns 120 formed on the source electrode 70 and the drain electrode 80, respectively.

Here, the buffer layer 20 is formed on the semi-insulating substrate 10 and includes an AlGaAs/GaAs superlattice buffer layer 21 for preventing substrate leakage current during the operation, and an AlGaAs buffer layer (i-AlGaAs) 23 formed of undoped AlGaAs on the AlGaAs/GaAs superlattice buffer layer 21.

Preferably, the AlGaAs/GaAs superlattice buffer layer 21 is formed of an AlGaAs layer having a thickness of about 30 Å to 50 Å and a GaAs layer having a thickness of about 30 Å to 50 Å that are repeated 30 to 50 times.

In addition, in order to improve the crystallinities of the AlGaAs layers and the carrier confinement of the channel the Al content of the crystals grown in the AlGaAs layer of the AlGaAs/GaAs superlattice buffer layer 21 is preferably less than the Ga content, e.g., less than about 0.3 moles.

The first conductive layer 40 includes a first spacer (i-AlGaAs spacer) 41 formed of undoped AlGaAs on the first Si doped layer 30, a channel layer (undoped InGaAs) 43 formed of undoped InGaAs on the first spacer 41, and a second spacer (i-AlGaAs spacer) 45 formed of undoped AlGaAs on the channel layer 43.

Preferably, the first spacer 41 is formed to a thickness of about 1 nm to 5 nm, the channel layer 43 is formed to a thickness of about 10 nm to 20 nm, and the second spacer 45 is formed to a thickness of about 2 nm to 10 nm.

In addition, in order to improve the crystallinities of the AlGaAs layers and the carrier confinement of the channel, the Al content of the crystals grown in the AlGaAs layers of the first spacer 41 and the second spacer 45 and growing are preferably less than the Ga content, e.g., less then about 0.3 moles.

In addition, in order to improve the crystallinities of the layers and the carrier confinement of the channel, the indium (In) content of the crystals crown in the channel layer 43 is preferably less than the Ga content, e.g., less than about 0.25 moles.

The second conductive layer 60 includes a Schottky contact layer (undoped AlGaAs) 61 formed of undoped AlGaAs on the second Si doped layer 50, and a cap layer (i-GaAs) 63 formed of undoped GaAs on the Schottky contact layer 61.

Here, the Al content of the crystals grown in the AlGaAs layers of the Schottky contact layer 61 in order to improve the carrier confinement capability of the channel layer and crystallinity is preferably less than the Ga content, e.g., less than about 0.3 moles.

In addition, the Schottky contact layer 61 and the cap layer 63 are preferably formed to a thickness of about 20 nm to 50 nm.

Meanwhile, in a structure of the epitaxial substrate, the source electrode 70 and the drain electrode 80 forming the ohmic contact are foamed deep into the first Si doped layer 30 by an ohmic annealing process, but the illustration is omitted in FIG. 1 for convenience. In addition, the gate electrode 90 forming a Schottky contact with the Schottky contact layer 61 is formed between the source electrode 70 and the drain electrode 80.

Here, after the undoped GaAs cap layer 63 is etched, the gate electrode 90 is preferably formed on the undoped AlGaAs Schottky contact layer 61.

The undoped AlGaAs Schottky contact layer 61 increases a breakdown voltage between a gate and a drain and a gate turn-on voltage, and thus linearity of the switching circuit can be improved and parallel conduction can be reduced.

Considering the input and output characteristics of a switching device, the gate electrode 90 is preferably disposed in the middle of the source electrode 70 and the drain electrode 80. In other words, the distance between the gate electrode 90 and the source electrode 70 is preferably the same as that between the gate electrode 90 and the drain electrode 80.

Meanwhile, the gate electrode 90 is preferably formed in a "⌐" shape so that an internal capacitor Cgs is formed between the source electrode 70 and an upper part of the gate electrode 90. Here, the internal capacitor Cgs may be formed in a metal-insulator-metal (MIM) structure including the gate electrode 90, the first and the second insulating layers 100 and 110, and the source electrode 70. Here, the capacitance can be calculated from the overlapping dimensions, and the internal capacitor Cgs can be designed according to the required capacitance.

In addition, the gate electrode 90 may be formed in a "⌐" shape so that an internal capacitor Cgd is formed between the drain electrode 80 and the upper part of the gate electrode 90. Here, the internal capacitor Cgd may be formed in an MIM structure including the gate electrode 90, the first and the second insulating layers 100 and 110, and the drain electrode 80.

In addition, the agate electrode 90 may be formed in a "T" shape so that internal capacitors Cgs and Cgd are formed between the source electrode 70 and the upper part of the gate electrode 90 and between the drain electrode 80 and the upper part of the gate electrode 90, respectively.

As described above, in the transistor of the semiconductor device, i.e., a high-frequency switching device, according to an exemplary embodiment of the present invention, Si concentrations of the first Si doped layer 30 and the second Si doped layer 50 are increased and contact resistance is reduced by deeply forming the ohmic contact between the source and drain so that an insertion loss in the on-state can be reduced.

Meanwhile, in order to reduce a substrate leakage current component in the off-state switching device and increase a switching speed of the switching circuit, it should be considered when concentrations of the Si planar doping layers is determined that the strength of an electric field generated by a control voltage applied to the gate electrode 90 in the off-state in a depth direction of the channel layer is gradually weaker as the depth becomes deeper.

Therefore, the doping concentration of the first Si doped layer 30 disposed deep from the Schottky contact surface should be lower than that of the second Si doped layer 50 disposed to a relatively shallow depth. In this case, a depletion region of a channel can be extended more rapidly toward the AlGaAs/GaAs superlattice layer 21 at the same gate voltage. Therefore, the switching speed can be increased and also the substrate leakage current can be reduced, and in result, an isolation characteristic of the switching circuit can be improved.

The concentration ratio of the second Si planar doped layer 50 and the first Si planar doped layer 30 is calculated from the depth of the channel layer depleted by the electric field of the gate electrode 90. In result, the dopant concentration of the second Si planar doped layer 50 should be more than about four times greater than the first Si planar doped layer 30, and the overall concentration is determined considering the insertion loss reduction in the on-state.

In other words, in the high-frequency switching device having the structure described above according to the present invention, in the epitaxial substrate having a double doped-layer structure of the first Si planar doped layer 30 and the second Si planar doped layer 50, the upper layer, i.e., the second Si planar doped layer 50, is designed to have a higher dopant concentration than the lower layer, i.e., the first Si doped layer 30, and preferably at least four times higher. Therefore, an extension speed of the depletion layer is regulated using the electric field strength of the gate electrode 90 according to a channel depth so that the isolation characteristic and switching speed can be improved by the reduction of the substrate leakage current component.

In the method of fabricating a switching device according to the conventional art, a cap layer doped with a high concentration is generally used to reduce an ohmic contact resistance. However, the structure has a problem of surface leakage between the gate and the source or between the gate and the drain, and thus requires an additional process such as a wide recess to overcome the surface leakage.

On the other hand, in the present invention, the source electrode 70 and the drain electrode 80 having a low contact resistance can be formed by an optimized rapid thermal annealing (RTA) process even though the undoped GaAs cap layer 63 is used. In addition, the breakdown voltage between the source and the gate and between the gate and the drain, and a gate turn-on voltage are increased so that the power characteristic can be improved.

In particular, such a structural characteristic shows its superiority in the off-state. Generally, the isolation characteristic of a switching circuit using a FET deteriorates with an increase in the voltage applied to the gate electrode in the off-state (reduced operating voltage or low voltage operation) since the gate effective control voltage applied to the gate electrode positively increases.

As described above, the second Si doped layer 50 preferably has a higher dopant concentration (more than about four times) than the first Si doped layer 30. For example, the dopant concentration of the first Si planar doped layer 30 may be about $0.5 \times 10^{12}$ cm$^{-2}$ to $2.0 \times 10^{12}$ cm$^{-2}$, and that of the second Si planar doped layer 50 may be about $2 \times 10^{12}$ cm$^{-2}$ to $8 \times 10^{12}$ cm$^{-2}$.

Meanwhile, in order to optimize the epitaxial substrate structure, the undoped AlGaAs Schottky contact layer 61 and the undoped GaAs cap layer 63 are included so that the gate breakdown voltage characteristic and gale turn-on voltage characteristic can be improved. When transmitting a high-power high-frequency signal, such a characteristic increases the resistance against the effective voltage introduced in the gate by the voltage swing, and thus improves the power characteristic and the distortion characteristic.

A method of fabricating the transistor of the semiconductor device having the structure described above according to an exemplary embodiment of the present invention will be described in more detail.

Referring to FIG. 1, an AlGaAs/GaAs superlattice buffer layer 21, and an AlGaAs buffer layer 23 formed of undoped AlGaAs as a buffer layer 20; a first Si doped layer 30; a first spacer 41 formed of undoped AlGaAs, a channel layer 43 formed of undoped InGaAs, and a second spacer 45 formed of undoped AlGaAs as a first conductive layer 40; a second Si doped layer 50 having a different dopant concentration than the first Si doped layer 30; and a schottky contact layer 61 formed of undoped AlGaAs, and a cap layer 63 formed of undoped GaAs as a second conductive layer 60, are formed in order on a GaAs semi-insulating substrate 10.

Here, the first Si planar doped layer 30 and the second Si planar doped layer 50 are preferably formed by a planar doping technique to include the Si dopant in concentrations between about $0.5 \times 10^{12}$ cm$^{-2}$ and $2.0 \times 10^{12}$ cm$^{-2}$ and between about $2 \times 10^{12}$ cm$^{-2}$ and $8 \times 10^{12}$ cm$^{-2}$, respectively.

Subsequently, a thin metal film, e.g., AuGe/Ni/Au, is formed on the undoped GaAs cap layer 63 and then processed by an RTA technique so that a source electrode 70 and a drain electrode 80 are formed to form the ohmic contact.

Meanwhile, in the method of fabricating the switching device according to conventional art, a cap layer doped with a high concentration is generally used to reduce the ohmic contact resistance. However, in the present invention, the thin metal film is thermally processed according to an optimized time-temperature profile, and thus penetrates deep into the first Si doped layer 30 in the process of alloying of the thin metal film with the semiconductor substrate. Therefore, even though there is the undoped GaAs cap layer 63 which is different from conventional art, the source electrode 70 and the drain electrode 80 having low ohmic contact resistance can be formed and the breakdown voltage can also be increased, and thus the power characteristic is improved.

After the ohmic contact is formed, an image reversal pattern (not shown in the drawings) is formed of, e.g., photoresist, etc. on the undoped GaAs cap layer 63. And then, the undoped GaAs cap layer 63 is first etched by a gate recess process so that a part of the Schottky contact layer 61 is exposed.

Subsequently, a First insulating layer 100 is deposited of, e.g., a silicon nitride ($Si_3N_4$) layer, and then a gate pattern having a thickness of 0.5 μm is formed of, e.g., photoresist, etc. Next, the $Si_3N_4$ layer is removed by, e.g., a reactive ion etching (RIE) process, and then a pattern is formed by an image reversal process. And, a surface oxide layer having a thickness of about 5 nm is removed on the exposed undoped AlGaAs Schottky contact layer 61 to improve the Schottky contact characteristic, and then Ti/Pt/Au for forming the gate electrode 90 is deposited thereon.

Subsequently, a second insulating layer 110 is formed of the same material as the first insulating layer 100 on the entire surface of the resultant structure. And, the second insulating layer 110 on the source electrode 70 and the drain electrode 80 is removed, and then metal patterns 120 for the source and drain electrodes are formed on the respective electrodes by, e.g., an electroplating process, thereby completing fabrication.

Generally, when there is gate leakage current during operation of a switching circuit, the gate effective control voltage is reduced. Since an on-voltage and an off-voltage are applied to the switch at a high power level during a full cycle of a RF signal, the switching circuit shows non-linear characteristics and thus is not effective as a switch and has a problem that the operating voltage should be increased. However, the improved gate leakage current characteristic and the increased turn-on voltage and breakdown voltage according to the present invention solve this problem so that a linear high-power high-frequency switching device can be fabricated.

Subsequently, the gate electrode 90 is formed by e.g., a lift-off process between the source electrode 70 and the drain electrode 80. Considering the input and output characteristics of the switch device, a distance between the gate electrode 90 and the source electrode 70 is preferably formed to be the same as that between the gate electrode 90 and the drain electrode 80. Meanwhile, the gate electrode 90 is preferably formed in the shape of "]", "[", or "T", as described above.

The present invention will now be described in more detail with reference to the following unlimited experimental examples. Various matters not mentioned below will be appreciated by those skilled in the art.

Example 1

Figure 2A:
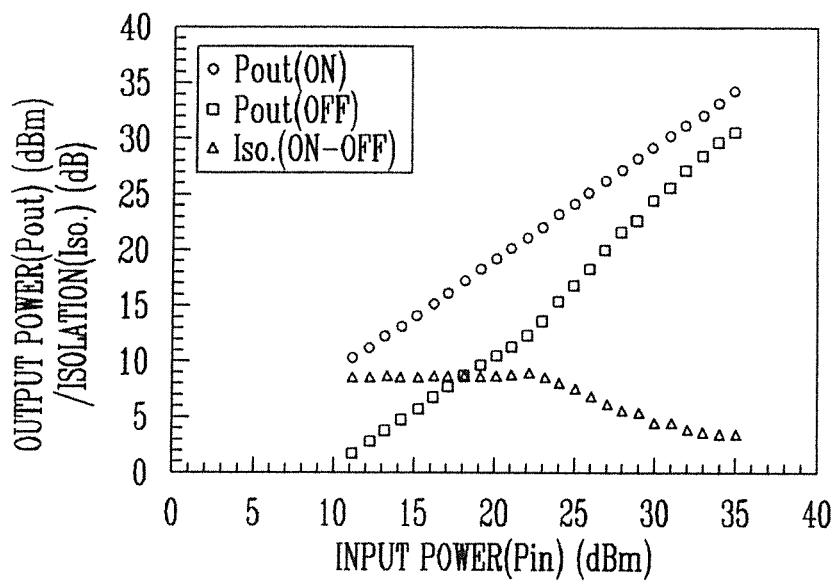
FIGS. 2A and 2B are graphs of output power and isolation versus input power when transistors of a semiconductor device according to a conventional art and an exemplary embodiment of the present invention are in an on-state and an off-state, respectively.
Figure 2B:
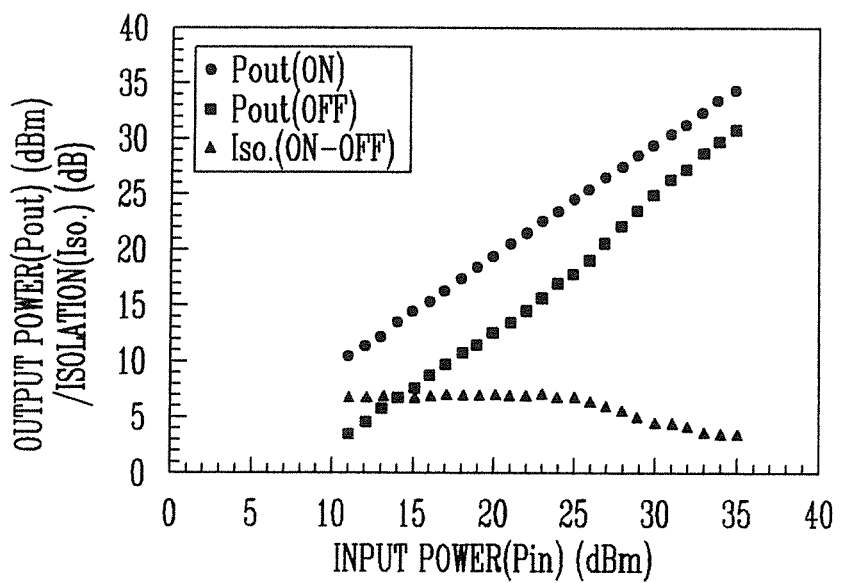

FIGS. 2A and 2B are graphs showing output power and isolation characteristics versus input power in the on-state and off-state for transistors of a semiconductor device according to the conventional art and an exemplary embodiment of the present invention, respectively.

Referring to FIG. 2A, the transistor of a semiconductor device, i.e., a switching device, according to the conventional art was fabricated and showed the dependence of output power with input power at an operating frequency of about 2.4 GHz in the on-state (-○-) and the off-state (-□-).

The fabricated switching device had a width of about 1.2 mm, and the unit gate width was about 150 μm. The power handling capability of a switch is defined as an input power at which isolation in the off-state deteriorates. Referring to FIG. 2A, the power handling capability of the conventional switching device was about 23 dBm. This value can be easily observed through the change of the isolation (-△-) indicating the difference in output power between the on-state and off-state.

Referring to FIG. 2B, a switching device including the gate electrode 90 having the "]" shape according to an exemplary embodiment of the present invention was fabricated and showed the plotted change of output power with input power at an operating frequency of about 2.4 GHz in the on-state (-●-) and off-state (-■-). In the switching device according to the present invention, the power handling capability was about 25 dBm as can be easily observed through the change of the isolation (-▲-) indicating the difference in the output power between the on-state and off-state.

In other words, the switching device having the gate electrode 90 having the "]" shape according to an exemplary embodiment of the present invention exhibited power handling capability improved by about 2 dB compared to the switching device having a conventional gate structure (a rectangular form). An even larger improvement in power handling capability was observed in a switching circuit shown in FIG. 3 employing the switching device according to an exemplary embodiment of the present invention.

Example 2

Figure 3:
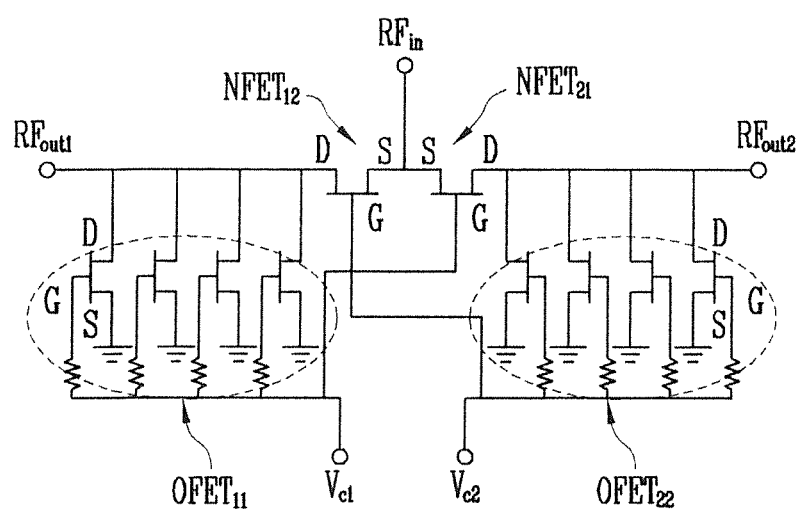
FIG. 3 is a circuit diagram of a single-pole-double-throw (SPDT) switch showing the superiority of a transistor of a semiconductor device according to an exemplary embodiment of the present invention.

FIG. 3 is a circuit diagram schematically illustrating a single-pole-double-throw (SPDT) switch showing the superiority of a transistor of a semiconductor device according to an exemplary embodiment of the present invention.

Referring to FIG. 3, the circuit is composed of two series transistors $NFET_{12}$ and $NFET_{21}$ having a gate width of about 1.2 mm, and eight shunt transistors $OFET_{11}$ and $OFET_{22}$ having a gate width of about 0.3 mm.

The eight shunt-connected transistors had a conventional gate electrode structure. The power characteristics of a case in which the two transistors connected in series had the conventional gate electrode structure and a case in which they had the gate electrode 90 of, e.g., the "]" shape were compared and the superiority of the present invention was confirmed.

Figure 4A:
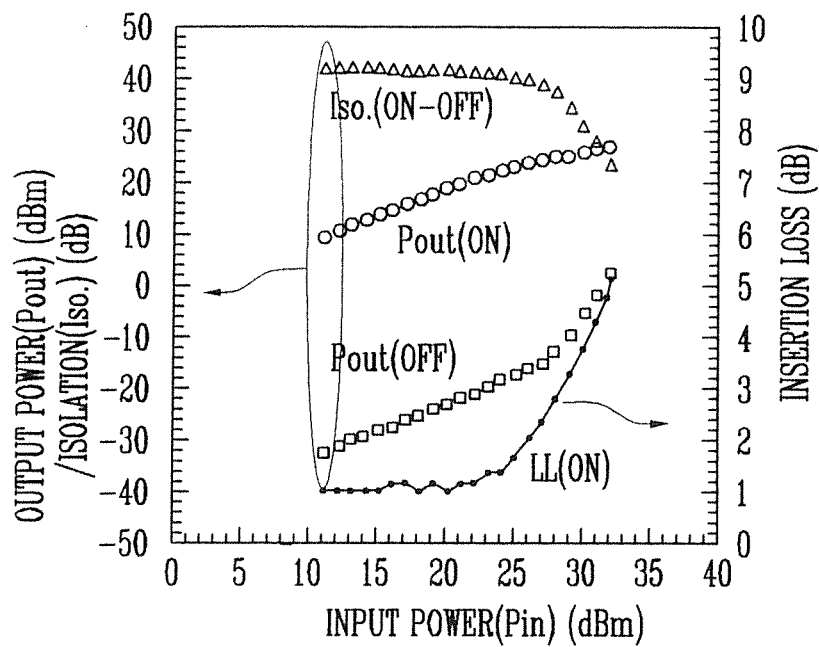
FIGS. 4A and 4B are graphs of output power, isolation, and insertion loss versus input power of SPDT circuits employing transistors of a semiconductor device according to a conventional art and an exemplary embodiment of the present invention.
Figure 4B:
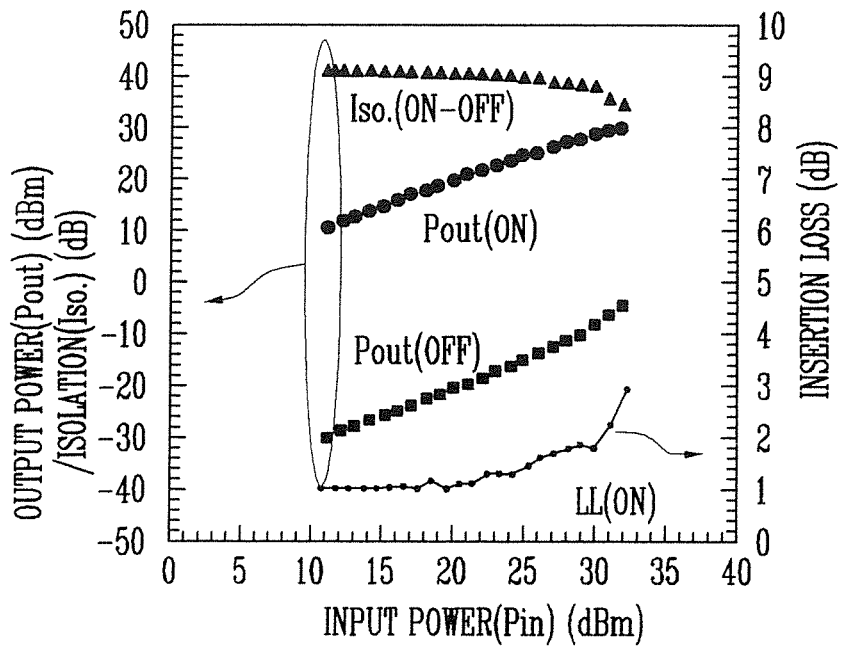

FIGS. 4A and 4B are graphs of output power, isolation, and insertion loss versus input power of SPDT circuits employing transistors of a semiconductor device according to conventional art and an exemplary embodiment of the present invention. The SPDT switching circuit (microwave monolithic integrated circuit: MMIC) devices of FIG. 3 were fabricated of switching devices according to conventional art and an exemplary embodiment of the present invention. FIGS. 4A and 4B are graphs of output power versus input power at an operating frequency of about 2.4 GHz in the on-state and off-state.

In FIG. 4A, for the conventional art, -○- indicates the output power in the on-state, -□- indicates the output power in the off-state, -Δ- indicates the difference in output power between the on-state and off-state represents isolation between the double throw in the SPDT, and -◇- which indicates the difference between the input power and the output power in the on-state which represents an insertion loss of an RF signal.

The power handling capability of a switching circuit is determined by the maximum current limit of a transistor in the on-state, and by the maximum voltage limit applied to the device in the off-state. However, the power handling capability is restricted since isolation loss in the off-state rather than RF signal compression in the on-state occurs.

Therefore, the power handling capability of a switching circuit is defined as an input power value at which isolation in the off-state deteriorates by about 1 dB. The input power at which the isolation or insertion loss decreased by about 1 dB was about 26 dBm, which is the power handling capability of the SPDT switching circuit according to the conventional art.

In FIG. 4B, for the exemplary embodiment of the present invention, -●- indicates the output power in the on-state, -■- indicates the output power in the off-state, -▲- indicates the difference in output power between the on-state and the off-state that means the isolation between the double throw in the SPDT, and -▼- indicates the difference between the input power and the output power in the on-state which represents an insertion loss of an RF signal. In the same manner as FIG. 4A, the input power at which the isolation and insertion loss decreased by about 1 dB was about 30 dBm, which indicates the power handling capability of the SPDT switching circuit according to an exemplary embodiment of the present invention. Thus, the power handling capability was improved by about 4 dB over the conventional art.

Such data indicates that the structure of the gate electrode 90 of the switching device according to an exemplary embodiment of the present invention prevents an increase in output power in the off-state, and increased output power reduces the effective voltage applied to the gate electrode 90 of the "]" shape by increasing a capacitance component Cgs between the source electrode 70 and the gate electrode 90. Thus, a switching circuit having superior power and distortion characteristics can be embodied.

In the transistor of a semiconductor device and the method of fabricating the same according to the present invention, a switching device having an optimized epitaxial substrate with a double doped-layer structure has not only merits obtained by changing the extension speed (in proportion to the change rate of the transconductance gradient) of the depletion region according to the channel depth, i.e., the increase of the isolation and switching speed, but also merits obtained by forming the Schottky gate contact on the undoped AlGaAs layer, i.e., the increase of the gate turn-on voltage and breakdown voltage and the decrease of the parallel conduction component. Accordingly, the maximum voltage that can be applied to the switching device can be increased, and as a result of this improved power handling capability, high-power and low-distortion characteristics and increased isolation can be expected from the switching device.

In addition, according to the present invention, when a switching circuit (MMIC) is designed using a switching device having an internal capacitor, the additional transmission line of a λ/4 transformer, inductor, or capacitor for improving power handling capability are not required near the switching device. Therefore, chip size and production cost can be reduced due to improved yield of the fabrication process and higher integration density.

FIG. 5 is a flow chart illustrating a process for fabricating a transistor of a semiconductor device. Process 500 includes sequentially forming a buffer layer, a first silicon (Si) planar doped layer, a first conductive layer, a second Si planar doped layer having a different dopant concentration from the first Si planar doped layer, and a second conductive layer on a semi-insulating substrate (block 502); forming a thin metal film on the second conductive layer to form a source electrode and a drain electrode for forming an ohmic contact to penetrate the first Si planar doped layer to a predetermined depth (block 504); etching a part of the second conductive layer to a predetermined depth (block 506); forming a first insulating layer on an entire upper surface of the source electrode, the drain electrode and an exposed portion of the second conductive layer, and removing a portion of the first insulating layer to expose a predetermined area of the etched second conductive layer (block 508); forming a gate electrode on the exposed second conductive layer such that an upper part of the gate electrode overlaps only the drain electrode (block 510); and forming a second insulating layer on an entire upper surface of a remaining portion of the first insulating layer and the gate electrode, removing the first and second insulating layers to expose predetermined areas of the source and drain electrodes, and then forming predetermined metal patterns on the exposed source and drain electrodes (block 512).

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of fabricating a transistor of a semiconductor device, comprising the steps of:
   sequentially forming a buffer layer, a first silicon (Si) planar doped layer, a first conductive layer, a second Si planar doped layer having a different dopant concentration from the first Si planar doped layer, and a second conductive layer on a semi-insulating substrate;
   forming a thin metal film on the second conductive layer to form a source electrode and a drain electrode for forming an ohmic contact to penetrate the first Si planar doped layer to a predetermined depth;
   etching a part of the second conductive layer to a predetermined depth;
   forming a first insulating layer on an entire upper surface of the source electrode, the drain electrode and an exposed portion of the second conductive layer, and removing a portion of the first insulating layer to expose a predetermined area of the etched second conductive layer;

forming a gate electrode on the exposed second conductive layer such that an upper part of the gate electrode overlaps only the drain electrode; and forming a second insulating layer on an entire upper surface of a remaining portion of the first insulating layer and the gate electrode, removing the first and second insulating layers to expose predetermined areas of the source and drain electrodes, and then forming predetermined metal patterns on the exposed source and drain electrodes.

2. The method according to claim 1, wherein the step of forming the buffer layer includes the steps of:

forming an AlGaAs/GaAs superlattice buffer layer for preventing substrate leakage current during the operation on the semi-insulating substrate; and forming an AlGaAs buffer layer of undoped AlGaAs on the AlGaAs/GaAs superlattice buffer layer.

3. The method according to claim 1, wherein the step of forming the first conductive layer includes the steps of:

forming a first spacer of undoped AlGaAs on the first Si doped layer;

forming a channel layer of undoped InGaAs on the first spacer; and forming a second spacer of undoped AlGaAs on the channel layer, and wherein the step of forming the second conductive layer includes the steps of:

forming a schottky contact layer of undoped AlGaAs on the second Si doped layer; and forming a cap layer of undoped GaAs on the Schottky contact layer.

4. The method according to claim 1, wherein the second Si planar doped layer is formed with an at least four times higher dopant concentration than the first Si planar doped layer.

5. The method according to claim 1, wherein the first Si doped layer has a dopant concentration between $0.5 \times 10^{12}$ cm$^{-2}$ and $2.0 \times 10^{12}$ cm$^{-2}$, and the second Si doped layer has a dopant concentration between $2 \times 10^{12}$ cm$^{-2}$ and $8 \times 10^{12}$ cm$^{-2}$.

* * * * *